United States Patent
Hwang et al.

(10) Patent No.: US 10,873,004 B2
(45) Date of Patent: Dec. 22, 2020

(54) LIGHT EMITTING DEVICE FOR LIGHT AMPLIFICATION USING GRAPHENE QUANTUM DOT AND METHOD FOR PRODUCING THE DEVICE

(71) Applicants: Sangmyung University Cheonan Council for Industry-Academic Cooperation Foundation, Chungcheongnam-do (KR); University-Industry Cooperation Group Of Kyung Hee University, Gyeonggi-do (KR)

(72) Inventors: Sung Won Hwang, Chungcheongbuk-do (KR); Suk Ho Choi, Gyeonggi-do (KR)

(73) Assignees: Sangmyung University Cheonan Council for Industry-Academic Cooperation Foundation, Chungcheongnam-do (KR); University-Industry Cooperation Group Of Kyung Hee University, Gyeonggi-do (KR)

( * ) Notice: Subject to any disclaimer, the term of this patent is extended or adjusted under 35 U.S.C. 154(b) by 0 days.

(21) Appl. No.: 16/375,872

(22) Filed: Apr. 5, 2019

(65) Prior Publication Data

US 2019/0312174 A1 Oct. 10, 2019

(30) Foreign Application Priority Data

Apr. 6, 2018 (KR) .................. 10-2018-0040377

(51) Int. Cl.
*H01L 33/06* (2010.01)
*H01L 33/00* (2010.01)
*H01L 33/26* (2010.01)

(52) U.S. Cl.
CPC ............ *H01L 33/06* (2013.01); *H01L 33/002* (2013.01); *H01L 33/005* (2013.01); *H01L 33/26* (2013.01)

(58) Field of Classification Search
CPC ..... H01L 33/06; H01L 33/002; H01L 33/005; H01L 33/26; H01L 51/444; H01L 29/413;
(Continued)

(56) References Cited

U.S. PATENT DOCUMENTS

2008/0011977 A1* 1/2008 Atwood ................. B82Y 15/00
252/62.51 R
2019/0334064 A1* 10/2019 Pourquier ............. H01L 33/505

FOREIGN PATENT DOCUMENTS

KR 10-2012-0067157 6/2012
KR 10-1274209 6/2013
(Continued)

OTHER PUBLICATIONS

Grounds of Reasons for Rejection dated May 5, 2020 From the Korean Intellectual Property Office Re. Application No. 10-2018-0040377. (5 Pages).

*Primary Examiner* — Shahed Ahmed (57) ABSTRACT

The present invention relates to a light-emitting device for light amplification using graphene quantum dots and a method of manufacturing the same, which includes a first conductive semiconductor base layer; a plurality of nanowires disposed on the first conductive semiconductor base layer and including a first conductive semiconductor core, an active layer, and a second conductive semiconductor layer sequentially formed from inside to outside; and a graphene quantum dot coating layer disposed on one or both of a surface and an interior of the nanowire, thereby providing a light-emitting device which maximizes light extraction and light amplification.

7 Claims, 7 Drawing Sheets

(58) Field of Classification Search
CPC ......... H01L 2224/05193; H01L 51/502; H01L 21/02601–02606; Y10S 977/773–777
See application file for complete search history.

(56) References Cited

FOREIGN PATENT DOCUMENTS

| | | |
|---|---|---|
| KR | 10-1444807 | 9/2014 |
| KR | 101505709 B1 * | 3/2015 |

* cited by examiner

LIGHT EMITTING DEVICE FOR LIGHT AMPLIFICATION USING GRAPHENE QUANTUM DOT AND METHOD FOR PRODUCING THE DEVICE

RELATED APPLICATIONS

This application claims the benefit of priority of Korean Patent Application No. 10-2018-0040377 filed Apr. 6, 2018, the contents of which are incorporated herein by reference in their entirety.

ACKNOWLEDGMENTS

This application is based upon work supported by the Korea Evaluation Institute of Industrial Technology (10067533), this application is also based upon work supported by the Ministry of Trade, Industry & Energy (MOTIE, Korea) under Industrial Technology Innovation Program No. 10067533.

FIELD AND BACKGROUND OF THE INVENTION

The present invention relates to a light-emitting device for light amplification using graphene quantum dots and a method of manufacturing the same.

Since the conventional light-emitting device using quantum dots has a structure in which a quantum dot structure is unstable and which is fundamentally impossible to solve defects when quantum dots are applied in a light emitting layer, the structure of the conventional light-emitting device is unstable.

SUMMARY OF THE INVENTION

The present invention is directed to providing a light-emitting device capable of improving light extraction and light amplification and a method of manufacturing the same.

According to an aspect of the present invention, there is provided a light-emitting device including: a first conductive semiconductor base layer; a plurality of nanowires disposed on the first conductive semiconductor base layer and including a first conductive semiconductor core, an active layer, and a second conductive semiconductor layer sequentially formed from inside to outside; and a graphene quantum dot coating layer disposed on one or both of a surface and an interior of the nanowire.

In the present invention, an average size of graphene quantum dots of the graphene quantum dot coating layer may be 100 nm or less.

In the present invention, 90% or more of total graphene quantum dots of the graphene quantum dot coating layer may have a uniform particle size.

In the present invention, the first conductive semiconductor base layer and the first conductive semiconductor core may include n-GaN.

In the present invention, the second conductive semiconductor layer may include p-GaN.

In the present invention, the active layer may have a multi-quantum-well structure.

In the present invention, the graphene quantum dot coating layer may be disposed in the multi-quantum-well structure.

According to another aspect of the present invention, there is provided a method of manufacturing a light-emitting device including: forming a first conductive semiconductor base layer; forming a plurality of nanowires including a first conductive semiconductor core, an active layer, and a second conductive semiconductor layer which are sequentially formed on the first conductive semiconductor base layer from inside to outside; and forming a graphene quantum dot coating layer on one or both of a surface and an interior of the nanowire.

In the present invention, the graphene quantum dot coating layer may be formed through spray-coating.

In the present invention, in a case in which the graphene quantum dot coating layer is formed on the surface of the nanowire, the graphene quantum dot coating layer may be formed after the nanowire is formed.

In the present invention, in a case in which the graphene quantum dot coating layer is formed inside the nanowire, the graphene quantum dot coating layer may be formed at least once among after the first conductive semiconductor core is formed and after the active layer is formed during the forming of the nanowire.

In the present invention, before the forming of the graphene quantum dot coating layer, a membrane filtering process of controlling material transmission according to a change in a molecular weight may be performed to filter a graphene quantum dot having a specific size included in a liquid.

In the present invention, the membrane filtering process may be a dialysis process.

BRIEF DESCRIPTION OF THE SEVERAL VIEWS OF THE DRAWINGS

The above and other objects, features and advantages of the present invention will become more apparent to those of ordinary skill in the art by describing exemplary embodiments thereof in detail with reference to the accompanying drawings, in which.

DESCRIPTION OF SPECIFIC EMBODIMENTS OF THE INVENTION

Hereinafter, the present invention will be described in detail.

Light Emitting Device

Figure 1:
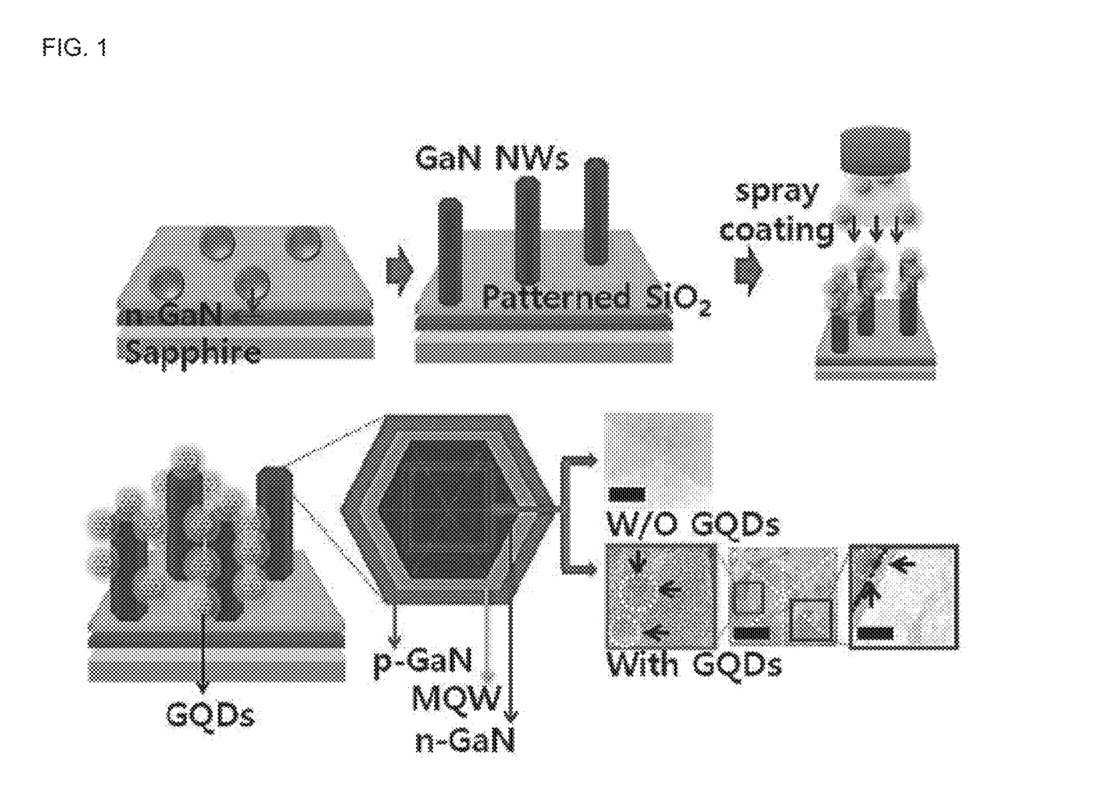
FIG. 1 is a view showing a process of manufacturing a three-dimensional graphene quantum dot (GQD) light-emitting device.
Figure 2A:
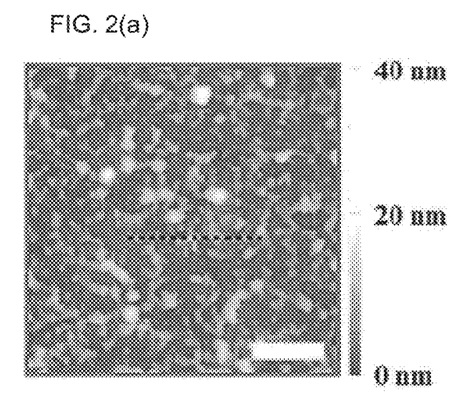
FIGS. 2(a), 2(b), 2(c) and 2(d) are views showing a size distribution and a microstructure distribution of the GQD.
Figure 2B:
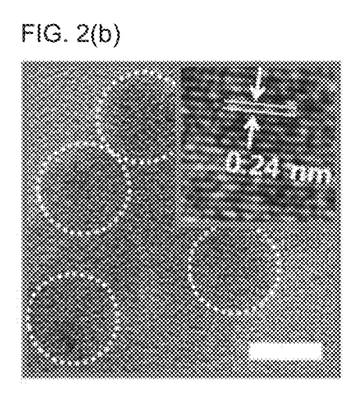
Figure 2C:
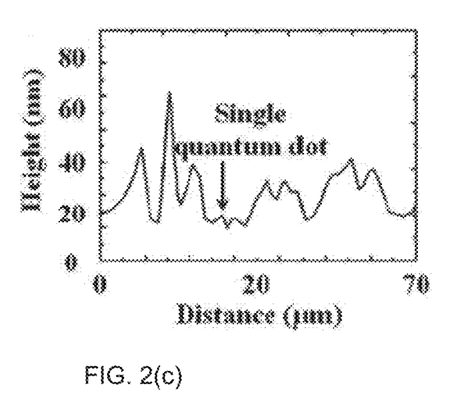
Figure 2D:
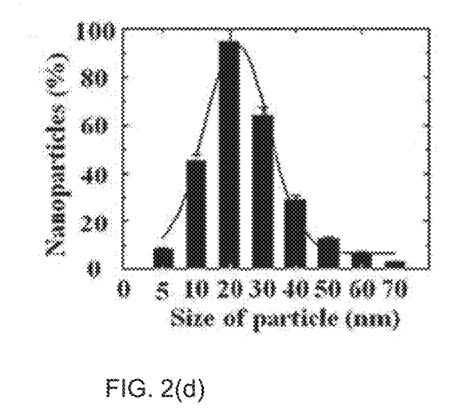

Referring to FIG. 1, a light-emitting device according to the present invention may include a substrate, a first conductive semiconductor base layer, an insulating layer, and a nanowire, which are sequentially disposed upward from a bottom, and may also include a graphene quantum dot (GQD) coating layer disposed on an outer surface of and/or inside the nanowire. In addition, although not illustrated in the drawing, the light-emitting device may further include a transparent electrode layer and a filling layer which are disposed on the nanowire, a first electrode electrically connected to the first conductive semiconductor base layer, and a second electrode electrically connected to a second conductive semiconductor layer.

The substrate may be provided as a substrate for semiconductor growth and may include an insulating, conductive, or semiconductor material such as sapphire, SiC, $MgAl_2O_4$, MgO, $LiAlO_2$, $LiGaO_2$, GaN, and the like. In the case of sapphire, the sapphire is a crystal having a hexa-rhombo R3c type symmetry, may have a c-axis lattice constant of 13.001 Å and an a-axis lattice constant of 4.758 Å, and may have a C(0001) plane, an A(11-20) plane, an R(1-102) plane, and the like. In this case, since a nitride thin film may be relatively easily grown from the C plane, and the C plane is stable at a high temperature, the sapphire with the C plane may typically be used as a substrate for growing nitride. Since irregularities are formed on a surface of the substrate, a light extraction efficiency can be increased. As necessary, a buffer layer for improving crystallinity of the first conductive semiconductor base layer may further be disposed on the substrate. For example, the buffer layer may be formed of an $Al_xGa_{1-x}N$ grown at a low temperature without doping. As necessary, the substrate may be removed and omitted. For example, in a case in which the light-emitting device is mounted on an external device, such as a package substrate, in a flip-chip manner, the substrate may be removed, and even in a case in which a Si substrate is used, the substrate may be removed.

The first conductive semiconductor base layer may be disposed on the substrate. The first conductive semiconductor base layer may be formed of a group III-V compound such as GaN. The first conductive semiconductor base layer may be formed of n-GaN doped with N-type impurities. The first conductive semiconductor base layer may provide a crystal face for growing the first conductive semiconductor core of the nanowire and may also be commonly connected to one side of each nanowire to serve as a contact electrode.

The insulating layer may be disposed on the first conductive semiconductor base layer. The insulating layer may include at least one among $SiO_2$, $Al_2O_3$, ZrO, and $TiO_2$. The insulating layer may be patterned to have a plurality of openings which expose a part of the first conductive semiconductor base layer. A diameter, a length, a position, and a growing condition of the nanowire may be determined according to sizes of the plurality of openings. The plurality of openings may have various shapes such as a circular, quadrilateral, hexagonal shape, and the like.

The plurality of nanowires may be disposed at positions corresponding to the plurality of openings. The nanowire may have a core-shell structure including a first conductive semiconductor core, which is grown from the first conductive semiconductor base layer exposed by the plurality of openings, and an active layer and a second conductive semiconductor layer which are sequentially formed on a surface of the first conductive semiconductor core.

The first conductive semiconductor core and the second conductive semiconductor layer may be formed of a semiconductors doped with a N-type impurity and a semiconductors doped with a P-type impurity, respectively, but are not limited thereto and, conversely, may also be formed of P-type and N-type semiconductors, respectively. The first conductive semiconductor core and the second conductive semiconductor layer may be formed of a nitride semiconductor such as a material having a composition formula of $Al_xIn_yGa_{1-x-y}N$ ($0 \leq x \leq 1$, $0 \leq y \leq 1$, $0 \leq x+y \leq 1$), and each of the layers may be formed as a single layer but may also be provided as a plurality of layers having a different property such as a doping concentration and a composition. However, AlInGaP- or AlInGaAs-based semiconductor may also be used as the first conductive semiconductor core and the second conductive semiconductor layer instead of the nitride semiconductor. For example, the first conductive semiconductor core may be formed of n-GaN doped with Si or C, and the second conductive semiconductor layer may be formed of p-GaN doped with Mg or Zn. A width of the first conductive semiconductor core may be greater than that of the opening of the insulating layer, but the present invention is not limited thereto.

The active layer may be disposed on a surface of the first conductive semiconductor core. The active layer emits light with predetermined energy caused by recombination of an electron and a hole, and may be a layer formed of a single material such as InGaN and the like. In addition, in a case in which the active layer has a single-quantum-well (SQW) structure or multi-quantum-well (MQW) structure in which a quantum-barrier-layer and a quantum-well-layer are alternately disposed and includes, for example, a nitride semiconductor, a GaN/InGaN structure may be used for the active layer. In a case in which the active layer includes InGaN, a crystal defect due to lattice mismatch may be decreased and an internal quantum efficiency of the light-emitting device may be increased by increasing a content of indium (In). In addition, a wavelength of emitted light may be adjusted according to the content of In in the active layer.

The number of the nanowire is not specifically limited, and for example, several tens to several millions of the nanowires may be formed. The nanowire may have a lower portion which is a hexagonal column region and an upper portion which is a hexagonal pyramid region. In this case, the first conductive semiconductor core may have an m-plane of the lower portion and an r-plane of the upper portion, which are different crystal faces, and thicknesses of the active layer and the second conductive semiconductor layer which are formed on an upper portion according to the crystal face may be different from each other. For example, the thicknesses of the active layer and of the second conductive semiconductor layer on the m-plane may be greater than the thicknesses of the active layer and the second conductive semiconductor layer on the r-plane. In addition, as necessary, the nanowire may also have a pyramid shape or column shape. Since the nanowire has such a three-dimensional shape, a light emitting surface is relatively wider so that a light efficiency can be increased.

The GQD coating layer may be disposed on at least one or both of a surface and an interior of the nanowire and may be disposed on both thereof. Specifically, the GQD coating layer may be disposed on the surface of the nanowire and simultaneously on the active layer having the MQW structure in the nanowire. In a case in which the GQD coating layer is disposed on both of the surface and the interior of the nanowire, light extraction and light amplification may be maximized. The GQD coating layer may be entirely or partially disposed on the surface and/or the interior of the nanowire.

An average size of the GQD may be 100 nm or less, preferably 70 nm or less, more preferably 50 nm or less. A lower limit of the average size may be, for example, 1 nm or more, or 5 nm or more.

90% of more of total GQDs may have a uniform particle size. The uniform particle size may mean a constant particle size within a specific deviation range. For example, 90% or more of total GQDs may have a constant particle size within a deviation range of ±10% or ±5%, and as a specific example, 90% or more of total quantum dots may have a particle size of 20±10% nm.

The transparent electrode layer may be electrically connected to the second conductive semiconductor layer. The transparent electrode layer may cover an upper surface and a side surface of the nanowire and may be disposed between adjacent nanowires to be connected to each other. The transparent electrode layer may be, for example, indium tin oxide (ITO), aluminum zinc oxide (AZO), indium zinc oxide (IZO), ZnO, gallium doped zinc oxide (ZnO:Ga, GZO), $In_2O_3$, $SnO_2$, CdO, $CdSnO_4$, or $Ga_2O_3$.

The filling layer may be disposed on the nanowire and the transparent electrode layer. The filling layer may fill between adjacent nanowires and may be disposed to cover the nanowire and the transparent electrode layer on the nanowire. As necessary, an upper surface of the filling layer may be curved along the nanowire. The filling layer may be formed of a transparent insulating material and may include, for example, $SiO_2$, SiNX, $Al_2O_3$, HfO, $TiO_2$, or ZrO. However, as necessary, the filling layer may also include a conductive material. In this case, the filling layer may be formed to be electrically connected to the second electrode or may be integrally formed therewith, and the light-emitting device may be mounted to have a flip-chip structure such that the first electrode and the second electrode face an external substrate such as a package substrate. As necessary, a passivation layer may further be disposed on the filling layer. The passivation layer may be disposed to expose only upper surfaces of the first electrode and the second electrode.

The first electrode and the second electrode may be disposed on the first conductive semiconductor base layer and the transparent electrode layer at one side of the light-emitting device to be electrically connected to the first conductive semiconductor base layer and the second conductive semiconductor layer, respectively. However, arrangements and shapes of the first electrode and the second electrode are illustrative examples and, as necessary, may be variously changed. As necessary, in a case in which the substrate is formed of a conductive material, the first electrode may be disposed under the substrate or may be omitted. The first electrode and the second electrode may each be formed as a single layer or multilayer structure formed of a conductive material. For example, each of the first electrode and the second electrode may include at least one among Au, Ag, Cu, Zn, Al, In, Ti, Si, Ge, Sn, Mg, Ta, Cr, W, Ru, Rh, Ir, Ni, Pd, Pt, and alloys thereof.

Manufacturing Method of Light Emitting Device

A method of manufacturing a light-emitting device according to the present invention includes: forming a first conductive semiconductor base layer; forming a plurality of nanowires including a first conductive semiconductor core, an active layer, and a second conductive semiconductor layer which are sequentially formed on the first conductive semiconductor base layer from inside to outside; and forming a GQD coating layer on at least one or both of a surface and an interior of the nanowire.

First, irregularities may be formed on an upper surface of a substrate and a first conductive semiconductor may be grown from the substrate to form the first conductive semiconductor base layer. The first conductive semiconductor base layer may provide a crystal growth surface on which the nanowire is grown and may also be provided as a structure which electrically connects one side of each nanowire. Accordingly, the first conductive semiconductor base layer may be formed of a semiconductor single crystal having electrical conductivity, and in this case, the substrate may be a substrate for crystal growth.

Next, an insulating layer may be formed on the first conductive semiconductor base layer. The insulating layer may be formed using chemical vapor deposition (CVD) or physical vapor deposition (PVD).

Next, after a mold layer is formed on the insulating layer, a plurality of openings may be formed in the insulating layer and the mold layer, respectively. The mold layer is for manufacturing the nanowire, may be formed to be adapted to a size and a shape of the nanowire, and may be removed after the nanowire is manufactured. Specifically, after a material for forming the mold layer is deposited on the insulating layer, the mold layer may be patterned using a separate mask pattern to form the plurality of openings in the insulating layer and the mold layer, respectively. The mold layer may be formed of, for example, silicon oxide, silicon nitride, and the like. A total thickness of the insulating layer and the mold layer may be designed by considering a target height of the nanowire. In addition, a size of the opening may be designed by considering a target size of the nanowire.

Next, a plurality of first conductive semiconductor cores may be formed by growing a first conductive semiconductor on a region at which the first conductive semiconductor base layer is exposed to fill the plurality of openings. The first conductive semiconductor core may be formed of, for example, an N-type nitride semiconductor and may be formed of the same material as the first conductive semiconductor base layer. The first conductive semiconductor core may be formed using a metal organic chemical vapor deposition (MOCVD) or molecular beam epitaxy (MBE) process.

Next, the mold layer is removed to expose side surfaces of the plurality of first conductive semiconductor cores, and the active layer and the second conductive semiconductor layer may be formed. First, the mold layer may be selectively removed with respect to the insulating layer and the first conductive semiconductor core so that the insulating layer may remain. The removing process may be performed by, for example, a wet etching process. The insulating layer may serve to prevent the active layer and the second conductive semiconductor layer from being connected to the first conductive semiconductor base layer in a subsequent process.

After the mold layer is removed, a thermal process for converting a crystal face of the first conductive semiconductor core into a stable face such as a semi-polar or non-polar crystal face which is advantageous for growing a crystal may be performed. Accordingly a width of the first conductive semiconductor core may be greater than that of the opening, a crystal may be regrown, and the crystallinity of the first conductive semiconductor core may be improved. However, this process may necessarily be omitted according to shapes of the openings and shapes of the grown first conductive semiconductor cores according to the shapes of the openings.

Next, the active layer and the second conductive semiconductor layer may be sequentially grown on the surface of the first conductive semiconductor core. Accordingly, the nanowire having the core-shell structure may be formed. According to a deposition method, the active layer and the second conductive semiconductor layer may have thicknesses which are different from each other on the m-plane and the r-plane of the first conductive semiconductor core.

In addition, as necessary, a charge blocking layer may further be disposed on the active layer. In this case, the active layer may be not disposed on an inclined surface of an upper portion of the first conductive semiconductor core, and the charge blocking layer may be disposed thereon. The charge blocking layer may serve to prevent a charge injected from the first conductive semiconductor core from moving to the second conductive semiconductor layer without being used for recombination of an electron and a hole in the active layer. The charge blocking layer may include a material having a band gap energy greater than the active layer. For example, the charge blocking layer may include AlGaN or AlInGaN.

Next, the GQD coating layer may be formed on the surface of and/or inside the nanowire. The GQD coating layer may be formed by entirely or partially spray-coating the nanowire with a coating solution including GQDs. The coating solution may include GQDs and a solvent for dispersing the GQDs. Deionized (DI) water, an organic solvent, or the like may be used for the solvent. A quantum dot concentration of the coating solution may range from 1,000 to 90,000 $m^2/g$ or from 0.1 to 5 mg/mL. Ultraviolet (UV)-Vis absorption or fluorescence may be used for a concentration analysis method. A thickness of the GQD coating layer may range, for example, from 0.34 to 10 nm.

In a case in which the GQD coating layer is formed on the surface of the nanowire, after the nanowire is formed, the GQD coating layer may be formed. Specifically, after the second conductive semiconductor layer (p-GaN) is grown, which is a time point at which the nanowire is completely formed, a surface of the second conductive semiconductor layer may be spray-coated with the GQDs, and in this case, the GQD coating layer may be formed on the surface of the second conductive semiconductor layer.

In a case in which the GQD coating layer is formed inside the nanowire, the GQD coating layer may be formed at least once among after the first conductive semiconductor core is formed and after the active layer is formed, in a process of forming the nanowire. For example, in a case in which the GQD coating layer is formed in the MQW structure which is the active layer, the first conductive semiconductor core (n-GaN) may be spray-coated with the GQDs after the first conductive semiconductor core (n-GaN) is grown, the MQW structure may be spray-coated with the GQDs after the MQW structure is grown, or both of the first conductive semiconductor core (n-GaN) and the MQW structure may be spray-coated with the GQDs two times.

Meanwhile, before the GQD coating layer is formed, a stable quantum dot structure having a size of 100 nm or less and a structure in which 90% or more of total graphene particles have a uniform size may be formed by performing a micro process after the GQDs are manufactured. Here, the micro process may be a membrane filtering process in which material transmission is controlled according to a change in a molecular weight to filter GQDs having a predetermined size or more in a liquid (a coating solution and the like). For example, a dialysis process may be used in the micro process, and specifically, a dialysis bag (molecular weight of cut-off: 3,500±500 Da) may be used in the micro process.

Next, a transparent electrode layer may be formed on the nanowire. The transparent electrode layer may extend between adjacent nanowires to cover an upper surface of the insulating layer and be formed as one layer on the plurality of nanowires.

Next, a filling layer may be formed on and/or under the transparent electrode layer. As necessary, the filling layer may be formed of a plurality of layers. Even when the plurality of layers may be formed of different materials or formed of the same material, the layers may be formed through different deposition processes.

Next, one region of the first conductive semiconductor base layer may be exposed to form a first electrode, and a second electrode may be formed on the transparent electrode layer. As necessary, a reflective electrode layer may also be formed instead of the transparent electrode layer, and the reflective electrode layer may include Ag or Al. In this case, the light-emitting device may be mounted on an external device, such as a package substrate, in a flip-chip manner.

Working Example

As illustrated in FIG. 1, a light-emitting device was manufactured by sequentially performing n-GaN growth, $SiO_2$ template manufacturing, un-GaN growth, n-GaN growth, GQD coating, MQW growth, GQD coating, p-GaN growth, $SiO_2$ filling, and ITO deposition.

Specifically, a first conductive semiconductor base layer was formed on a sapphire substrate by growing n-GaN as a first conductive semiconductor. Next, a $SiO_2$ insulating layer was formed on the first conductive semiconductor base layer, a mold layer was formed on the insulating layer, and then the insulating layer and the mold layer were patterned using a mask pattern to form a plurality of openings in the insulating layer and the mold layer. Next, n-GaN was grown as the first conductive semiconductor on regions in which the first conductive semiconductor base layer was exposed to fill the plurality of openings so as to form a plurality of first conductive semiconductor cores. Next, the mold layer was removed to expose side walls of the plurality of first conductive semiconductor cores. Next, the plurality of first conductive semiconductor cores were spray-coated with GQDs. Next, active layers having the MQW structure were formed. Next, the active layers were spray-coated with the GQDs. Next, second conductive semiconductor layers formed of p-GaN were formed to manufacture nanowires. Next, surfaces of the nanowires were spray-coated to form GQD coating layers. Next, a filling layer, a transparent electrode layer (ITO), a first electrode, and a second electrode were sequentially formed to manufacture the light-emitting device.

Comparative Example 1

During the manufacture of a light-emitting device, the light-emitting device was manufactured through the same method as Working Example except that the GQD coating layer was not formed.

Comparative Example 2

During the manufacture of a light-emitting device, the light-emitting device was manufactured through the same method as Working Example except that the GQD coating layer was formed only on the surfaces of the nanowires.

Comparative Example 3

During the manufacture of a light-emitting device, the light-emitting device was manufactured through the same method as above-described Working Example except that the GQD coating layer was formed only inside the nanowires.

Test Example 1

Size Distribution and Microstructure Distribution of GQD

FIG. 2 is a view showing a size distribution and a microstructure distribution of GQDs. FIG. 2a shows an atomic force microscope (AFM) analysis result of the GQDs, and the quantum dots having the sizes ranging from 5 to 50 nm were well formed. FIG. 2b shows a transmission electron microscope (TEM) analysis result of the GQDs, and a uniform structure having a size of 10 nm was formed. Since 0.24 nm of a lattice fringe is confirmed in an inset image, it is confirmed that the quantum dot having a defect-free single crystal structure was formed. FIG. 2c shows a confirmation result of a line profile along a black dotted line of FIG. 2a, and the quantum dots having uniform sizes were formed. FIG. 2d shows a confirmation result of a size distribution of the quantum dots, wherein the quantum dots having the sizes ranging from 5 to 50 were formed, and quantum dots having the sizes ranging from 10 to 30 nm occupied most of distribution.

Test Example 2

Structure and Light Emitting Property Analysis of GQD

Figure 3A:
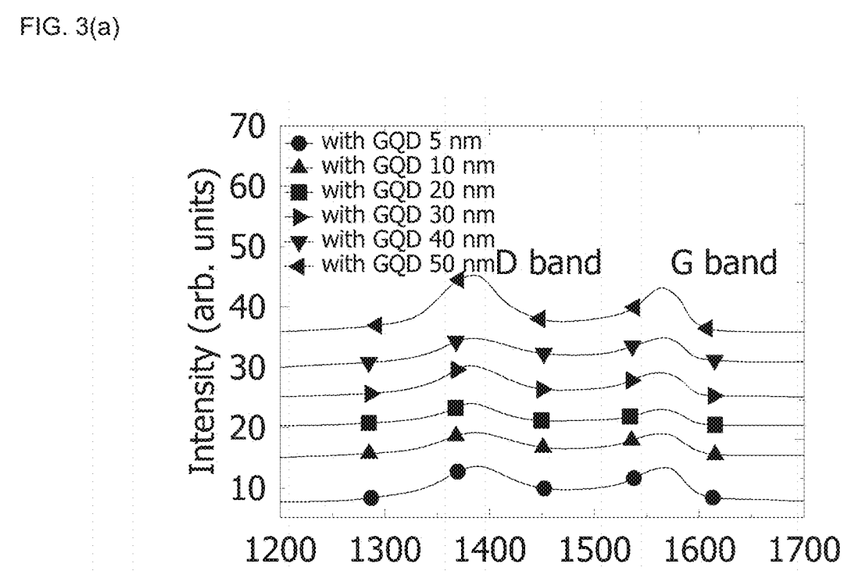
FIGS. 3(a) and 3(b) are views showing a structural property and a light emitting property of the GQD.
Figure 3B:
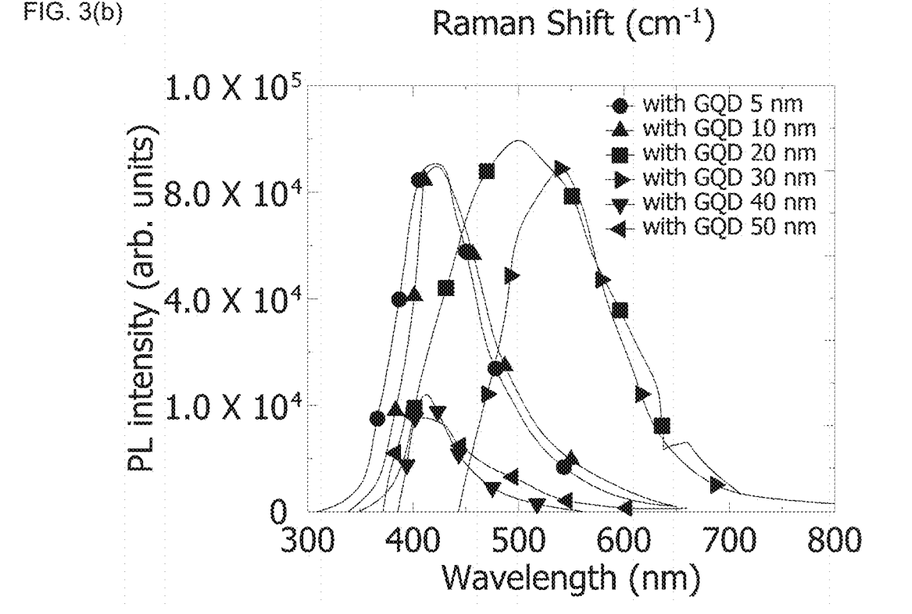

FIG. 3 is a view showing a structural property and a light emitting property of the GQDs. FIG. 3a shows Raman analysis result of the GQDs, and it is confirmed that D peak (defect) was not increased even though a size of the GQD is changed. FIG. 3b shows a photoluminescence (PL) analysis result, and a light emitting property was changed according to a change in the size of the GQD.

Test Example 3

Figure 4:
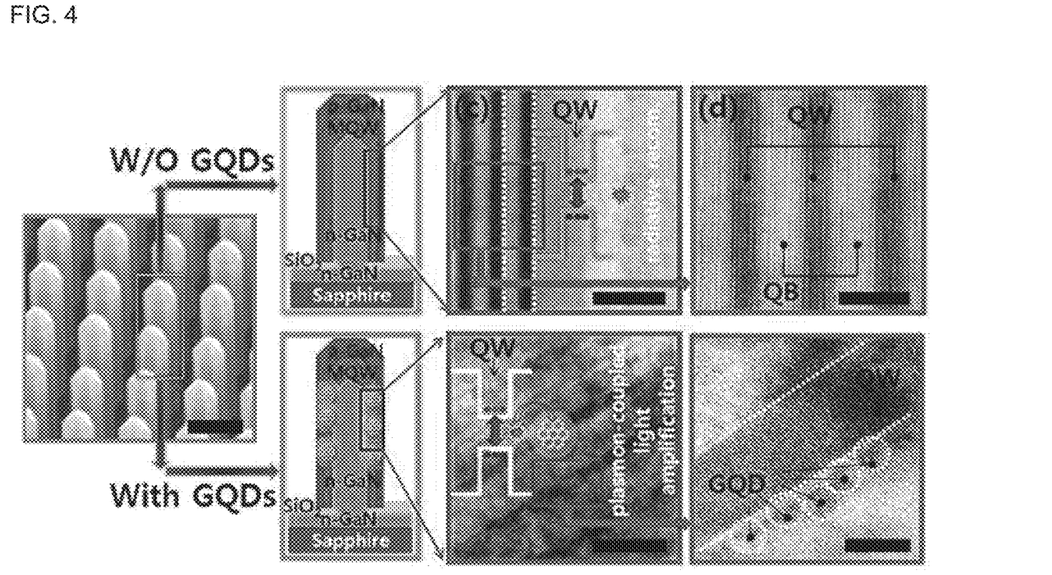
FIG. 4 is a view showing a microstructure of the three-dimensional light-emitting device according to whether the GQD is applied thereto.

Microstructure and Light Emitting Property Analysis of Light Emitting Device According to Application of GQD FIG. 4 is a view showing a microstructure of the three-dimensional light-emitting device according to whether the GQDs are applied thereto, wherein a left image shows a scanning electron microscope (SEM) analysis result of the GQDs, and right images show TEM analysis results in which upper images show a case in which there was no GQD in a MQW and lower images show a case in which quantum dots were well-formed in the MQW.

Figure 5A:
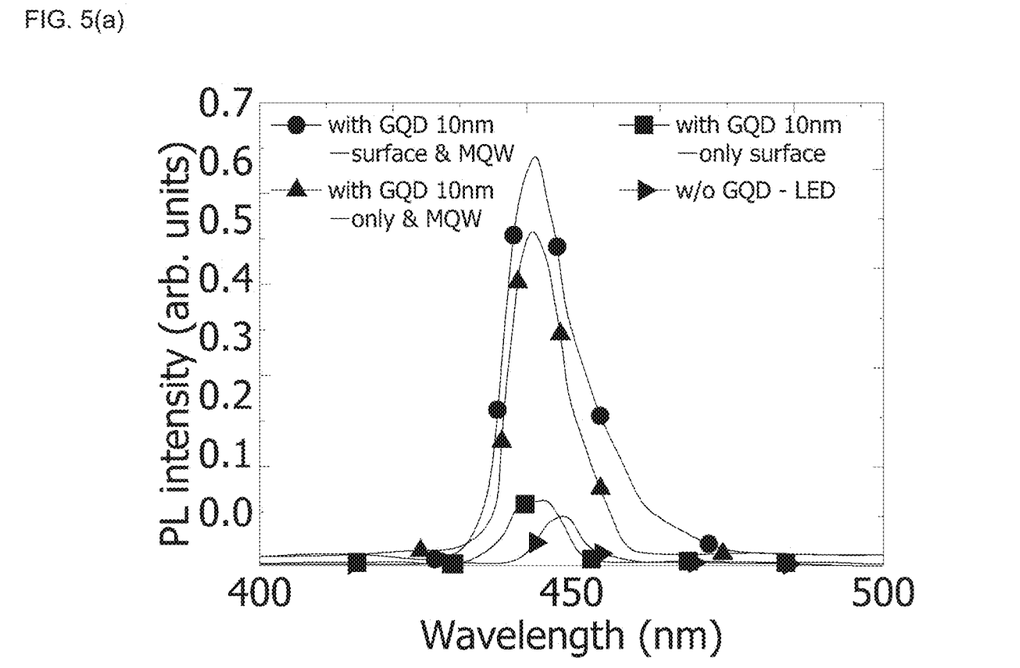
FIGS. 5(a) and 5(b) are views showing a light emitting property of the three-dimensional light-emitting device according to whether the GQD is applied thereto.
Figure 5B:
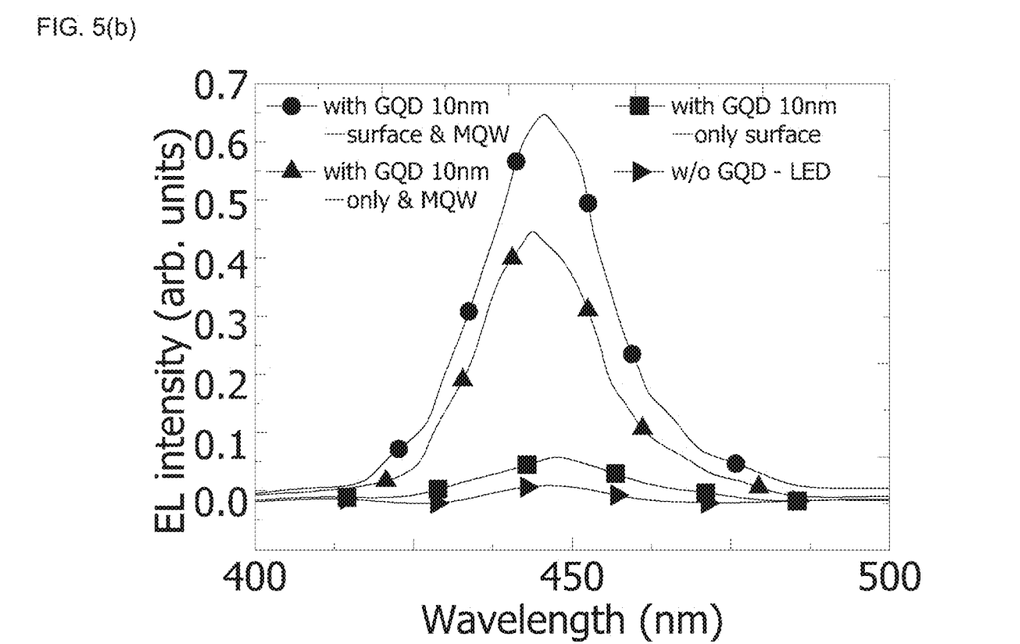

FIG. 5 is a view showing a light emitting property of the three-dimensional light-emitting device according to whether the GQDs are applied thereto. FIG. 5a shows a PL analysis result of a GQD-light-emitting diode (LED), and a PL property was changed according to whether there were GQDs and positions in which the GQDs were formed, and a light emitting property of a structure in which the quantum dots were applied to both of MQW (interior) and p-GaN (surface) of the nanowire was significantly superior to the other three cases (a case in which the GQD coating layer was formed only on the surface of the nanowire, a case in which the GQD coating layer was formed only on the interior of the nanowire, and a case in which the GQD coating layer was not formed on both of the surface and the interior of the nanowire) due to a light amplification property. FIG. 5b shows an electroluminescence (EL) analysis result of the GQD-LED, likewise an EL property was changed according to whether there were GQDs and positions in which the GQDs were formed, and a light emitting property of the structure, in which the quantum dots were applied to both of the MQW and the p-GaN of the nanowire, is significantly superior due to a light amplification property.

Test Example 4

Figure 6A:
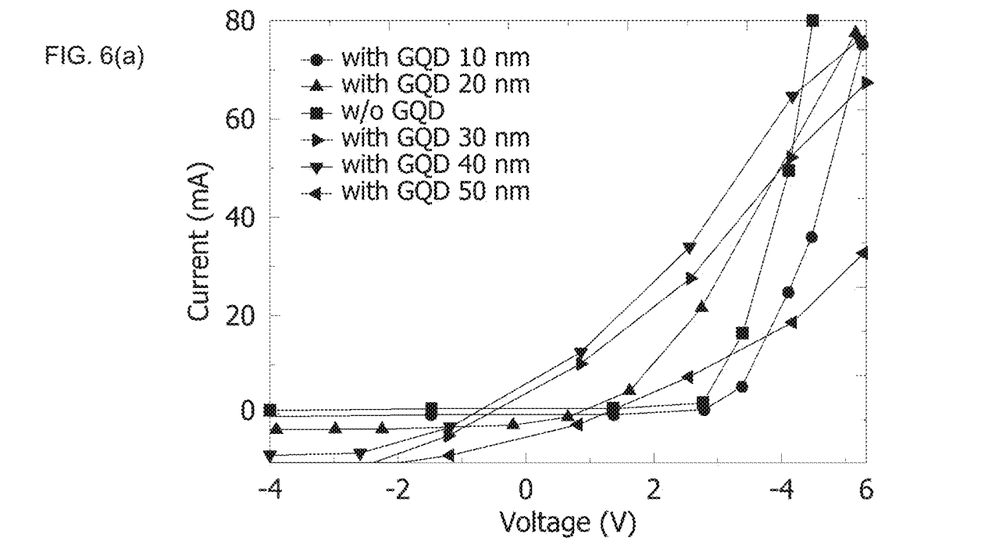
FIGS. 6(a) and 6(b) are views showing a light amplification property of the three-dimensional GQD light-emitting device structure.
Figure 6B:
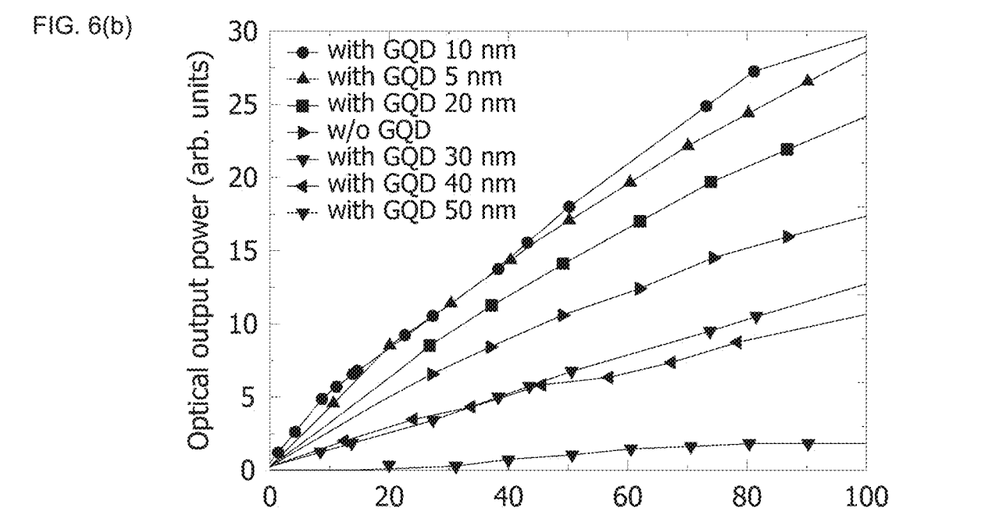

Light Amplification Property Analysis of Light Emitting Device According to Application of GQD FIG. 6 is a view showing a light amplification property of the three-dimensional GQD light-emitting device structure. FIG. 6a shows a current (I)-voltage (V) analysis result of the GQD-LED, an I-V property was changed according a size of the GQD, and an electrical property of the structure, in which the quantum dots were applied to both of the MQW and the p-GaN of the nanowire, was superior. FIG. 6b shows an optical output power analysis result of the GQD-LED, an optical output power property was changed according to the size of the GQD, and an electrical output power property of the structure, in which the quantum dots were applied to both of the MQW and the p-GaN of the nanowire, was superior due to the light amplification property.

Test Example 5

Figure 7:
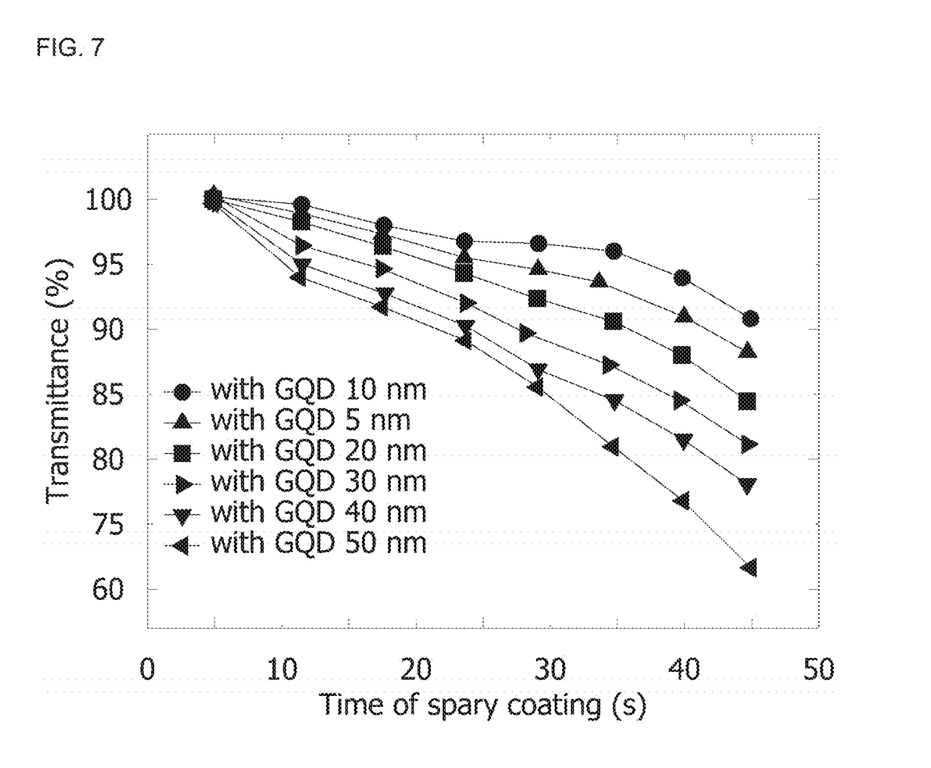
FIG. 7 is a view showing a light extraction property of the three-dimensional light-emitting device according to a GQD structure.

Light Extraction Effect Analysis of Light Emitting Device According to GQD Structure FIG. 7 is a view showing a light extraction property of the three-dimensional light-emitting device according to a GQD structure, and it is confirmed that a light extraction efficiency was changed according to the size of the GQD. Specifically, in a case in which an average size of the GQDs is 10 nm, since a transmittance for ultraviolet light is high, light may be reflected in a state in which the light extraction efficiency is high. However, in a case in which the average size of the GQDs is 5 nm, since the transmittance for the ultraviolet light is relatively low and the transmittance for the ultra-violet is decreased as the average size of the GQDs is increased from 30 nm to 50 nm, the light extraction efficiency is decreased.

As described above, a light-emitting device for light amplification using graphene quantum dots according to the present invention is a fused three-dimensional light-emitting device which maximizes light extraction and light amplification. Since the light-emitting device has a stable quantum dot structure having a size of 100 nm or less and a structure in which 90% or more of total grapheme particles have a uniform size by performing a micro process (which is a membrane filtering process of controlling material transmission according to a change in a molecular weight to filter the graphene quantum dots having sizes greater than a predetermined size in a liquid) after grapheme quantum dots are manufactured, the present invention provides a technology of overcoming limitations to fundamentally solve issues of a conventional light-emitting device, and a technical feature in which an optimal structure maximizes reliability. In addition, the present invention has novelty which is not present in the conventional market and provides a high value added technology. In addition, a structure and a process of the composite three-dimensional graphene quantum dot light-emitting device of the present invention are a structure and a process which are applicable for mass production, and the present invention provides a design capable of maximizing productivity through cost and turnaround time (TAT) reduction.

What is claimed is:

1. A light-emitting device comprising:
   a first conductive semiconductor base layer;
   a plurality of nanowires disposed on the first conductive semiconductor base layer and including a first conductive semiconductor core, an active layer, and a second conductive semiconductor layer which are sequentially formed from inside to outside; and
   a graphene quantum dot coating layer disposed on the first conductive semiconductor core, on the active layer, and on the second conductive semiconductor layer, respectively.

2. The light-emitting device of claim 1, wherein an average size of graphene quantum dots of the graphene quantum dot coating layer is 100 nm or less.

3. The light-emitting device of claim 1, wherein 90% or more of total graphene quantum dots of the graphene quantum dot coating layer have a uniform particle size.

4. The light-emitting device of claim 1, wherein the first conductive semiconductor base layer and the first conductive semiconductor core include n-GaN.

5. The light-emitting device of claim 1, wherein the second conductive semiconductor layer includes p-GaN.

6. The light-emitting device of claim 1, wherein the active layer has a multi-quantum-well structure.

7. The light-emitting device of claim 6, wherein the graphene quantum dot coating layer is disposed in the multi-quantum-well structure.

* * * * *

UNITED STATES PATENT AND TRADEMARK OFFICE
CERTIFICATE OF CORRECTION

PATENT NO.         : 10,873,004 B2
APPLICATION NO.    : 16/375872
DATED              : December 22, 2020
INVENTOR(S)        : Sung Won Hwang et al.

Page 1 of 1

It is certified that error appears in the above-identified patent and that said Letters Patent is hereby corrected as shown below:

In the Specification

In the Section ACKNOWLEDGEMENTS:

In Column 1 at Line 21, insert the following:
--This application is also based upon work supported by a grant to J.-W. Suh from the Next-Generation BioGreen 21 Program (no. PJ01337101), Rural Development Administration, Republic of Korea.--

Signed and Sealed this
Thirteenth Day of April, 2021

Drew Hirshfeld
*Performing the Functions and Duties of the*
*Under Secretary of Commerce for Intellectual Property and*
*Director of the United States Patent and Trademark Office*